United States Patent [19]
Taneda

[11] Patent Number: 5,359,218
[45] Date of Patent: Oct. 25, 1994

[54] SEMICONDUCTOR MEMORY DEVICE WITH SELECTION GATE IN A GROOVE

[75] Inventor: Hirohito Taneda, Yokohama, Japan

[73] Assignee: Kabushiki Kaisha Toshiba, Kawasaki, Japan

[21] Appl. No.: 955,278

[22] Filed: Oct. 1, 1992

[30] Foreign Application Priority Data

Oct. 3, 1991 [JP] Japan .................. 3-281911

[51] Int. Cl.$^5$ .......................... H01L 27/115
[52] U.S. Cl. .................. 257/321; 257/316; 257/408; 257/622
[58] Field of Search ............ 257/321, 316, 408, 622; 365/185

[56] References Cited

U.S. PATENT DOCUMENTS

| | | | |
|---|---|---|---|
| 4,649,520 | 3/1987 | Eitan | 257/318 |
| 4,949,140 | 8/1990 | Tam | 257/408 |
| 4,989,053 | 1/1991 | Shelton | 257/321 |
| 4,989,054 | 1/1991 | Arima et al. | 257/316 |
| 5,017,979 | 5/1991 | Fujii et al. | 257/321 |

FOREIGN PATENT DOCUMENTS

| | | |
|---|---|---|
| 3905634 | 8/1989 | Denmark . |
| 0162737 | 11/1985 | European Pat. Off. . |
| 0210809 | 2/1987 | European Pat. Off. . |
| 0416574 | 3/1991 | European Pat. Off. ...... 365/185 |
| 57-80779 | 5/1982 | Japan .................. 257/321 |
| 57-91561 | 6/1982 | Japan . |
| 62-245676 | 10/1987 | Japan . |
| 1-10673 | 1/1989 | Japan .................. 365/185 |
| 1-128472 | 5/1989 | Japan .................. 365/185 |
| WO83/03167 | 9/1983 | PCT Int'l Appl. . |
| 2239347 | 6/1991 | United Kingdom . |

OTHER PUBLICATIONS

Lander et al., "Recessed Gate One-Device Cell Memory Array", IBM Technical Disclosure Bulletin, vol. 18, No. 12, May 1976, New York, US, pp. 3951-3952.

Arima et al., "A High Density High Performance Cell for 4M Bit Full Feature Electrically Erasable/Programmable Read-Only Memory", Japanese Journal of Applied Physics, vol. 30, No. 3A, Mar. 1, 1991, Tokyo, JP, pp. 334-337.

Primary Examiner—Rolf Hille
Assistant Examiner—Robert Limanek
Attorney, Agent, or Firm—Banner, Birch, McKie & Beckett

[57] ABSTRACT

When the surfaces of a selection gate electrode and a floating gate electrode are thermally oxidized with the selection gate electrode disposed below the floating gate electrode, the thickness of a gate oxide film formed on the selection gate electrode can be made larger than that of a gate oxide film formed on the other portion. As a result, the coupling ratio of a memory transistor can be increased. Thus, the coupling ratio can be adequately increased by partly increasing the thickness of the insulation film between the floating gate electrode and the semiconductor substrate.

11 Claims, 8 Drawing Sheets

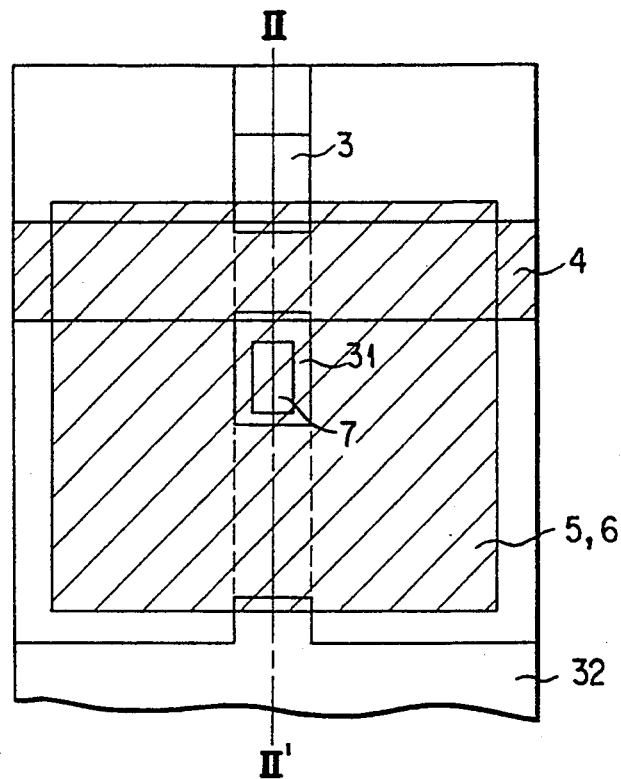
F I G. 3
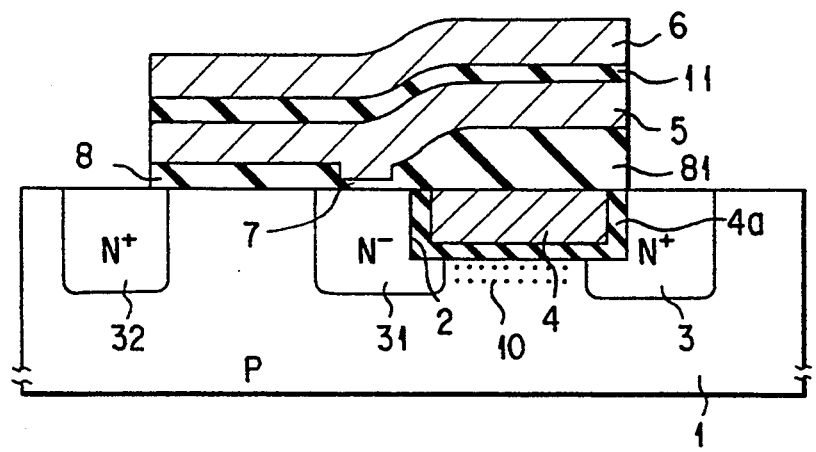
F I G. 4

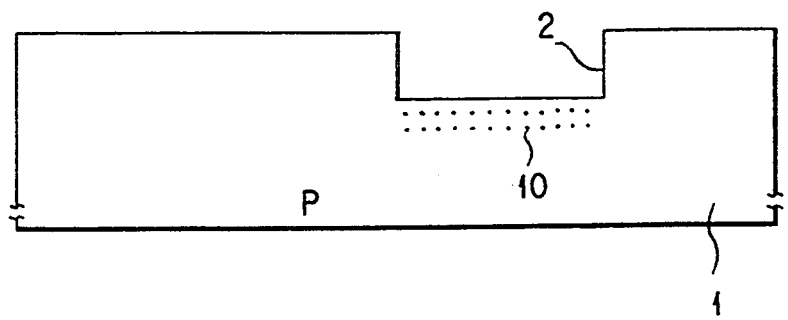
F I G. 5A
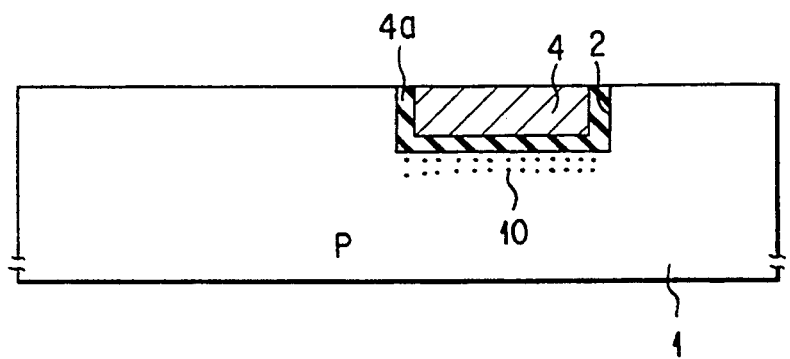
F I G. 5B
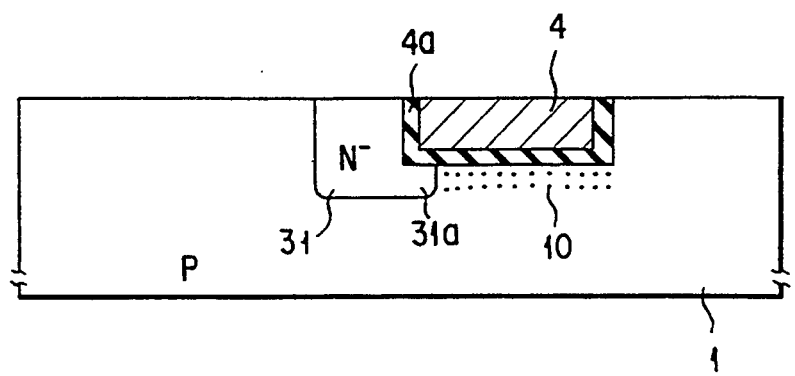
F I G. 5C

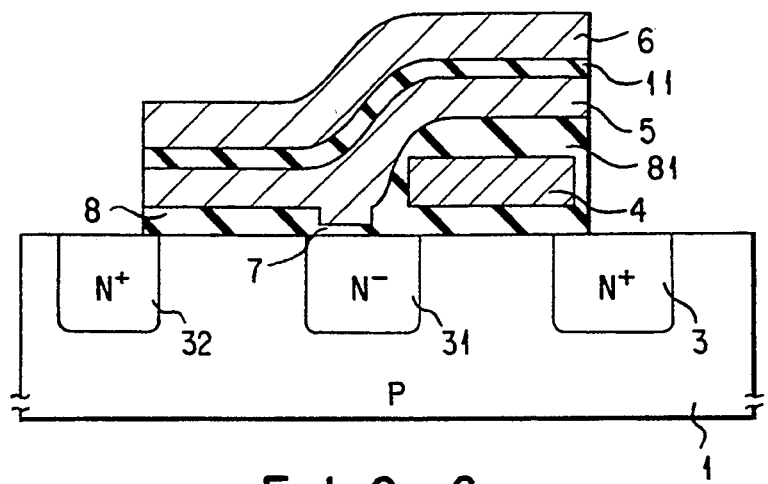
F I G. 6
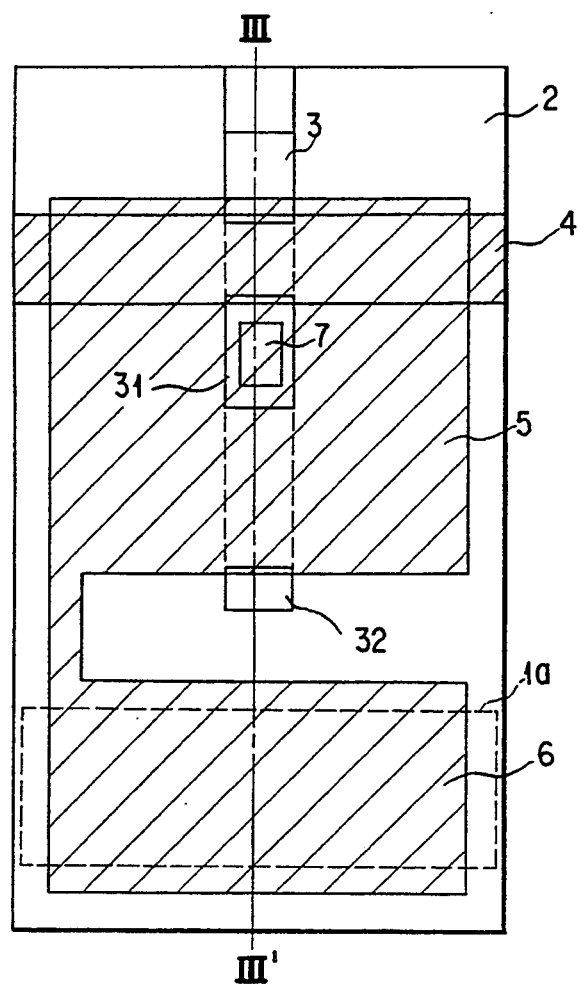
F I G. 7

$$CR = \frac{C2}{C1 + CW + C31}$$

$$CR = \frac{C2}{C1 + CW + C3}$$

SEMICONDUCTOR MEMORY DEVICE WITH SELECTION GATE IN A GROOVE

BACKGROUND OF THE INVENTION

1. Field of the Invention

The present invention relates to a nonvolatile semiconductor memory device including an insulated-gate field effect transistor having a selection gate electrode.

2. Description of the Related Art

A nonvolatile semiconductor memory device is a well-known device among the conventional semiconductor devices. Unlike an EPROM which requires ultra-violet rays for erasing, an electrically erasable and programmable read only memory (EEPROM) has a feature that the memory can be easily treated since data can be programmed with the memory mounted on the board and since a generation circuit for generating high voltages required for erasing and programming and a peripheral circuit thereof are disposed in the memory. Various types of cell structures for the EEPROM are proposed. EEPROMs may be roughly divided into two types, i.e., a floating gate type and a MNOS type. The floating gate EEPROM has a floating gate and electrons are accumulated in a polysilicon layer completely covered with an insulation film in the same manner as in the EPROM. The MNOS type EEPROM traps electrons and holes in the nitride film or in the interface between the oxide film and the nitride film. In either structure, the nonvolatile storing operation is effected by trapping electrons and holes in a portion between the gate and the substrate of the MOS transistor to change the threshold voltage of the MOS transistor.

FIG. 1 shows an example of a conventional floating gate EEPROM cell using a tunnel oxide film and having a stacked gate structure. FIG. 1 is a plan view of a cell portion of the EEPROM. FIG. 2 is a cross sectional view taken along the line I—I' of FIG. 1. As shown in FIGS. 1 and 2, $N^+$-impurity diffusion layers 3 and 32 and $N^-$-impurity diffusion layer 31 are formed in a semiconductor substrate 1 such as a P-polysilicon substrate. An insulation film 8 such as an $SiO_2$ film is formed on the semiconductor structure. A floating gate electrode 5 and a selection gate 4, both formed of polysilicon, are formed on the insulation film 8. The thickness of the insulation film 8 is approximately 4000 Å (angstroms). The impurity diffusion layers 32 and 3 are disposed on both sides of the electrodes 4 and 5 as the source and drain regions in the semiconductor substrate 1. A control gate electrode 6 of polysilicon is stacked over the floating gate electrode 5 with an inter-level insulation film 11 disposed therebetween. The selection gate electrode 4, and the $N^-$-impurity diffusion layer 31 and $N^+$-impurity diffusion layer 3 which are disposed on both sides of the selection gate electrode 4 are combined to constitute a first insulated-gate field effect transistor (which is hereinafter referred to as a "selection transistor"). The floating gate electrode 5, control gate electrode 6, and the $N^+$-impurity diffusion layer 32 and $N^-$-impurity diffusion layer 31 which are disposed on both sides of the above gate electrodes are combined to constitute a second insulated-gate field effect transistor (which is hereinafter referred to as a "memory transistor"). Part of the insulation film 8 which lies between the gate electrode 5 and the semiconductor substrate 1 of the memory transistor is formed as an oxide film 7 which is as thin as approximately 100 Å. The thin insulation film 7 is called a tunnel oxide film. Electrons can be injected into or emitted from the floating gate electrode 5 by passing a current which causes electrons to be tunneled through the oxide film 7. The erasing operation is effected by applying a high voltage of 15 to 20 V to the control gate electrode 6 and grounding the drain 3 to inject electrons into the floating gate electrode 5. The writing operation is effected by grounding the control gate electrode 6 and applying a high voltage to the drain 3 to emit electrons from the floating gate electrode 5. A plurality of cells described above are connected to word lines and bit lines which are not shown in the drawing and a peripheral circuit such as a high voltage generating circuit is added to constitute the EEPROM described before. As the above floating gate EEPROM, an EEPROM which has the control gate electrode and floating gate electrode arranged on the same plane is provided in addition to the EEPROM with the above stacked structure. In the EEPROM, the surface is made flat but the occupied area becomes large.

However, the EEPROM may not be formed with high integration density because of the presence of the selection gate electrode and it is also difficult to lower the cost thereof. That is, since the distance between the selection gate electrode and the floating gate electrode becomes shorter with an increase in the integration density, the aspect ratio between the gate electrodes becomes higher. The gate electrodes are generally isolated from each other by means of a deposited insulation film of BPSG or PSG. But the deposited insulation film of BPSG or PSG is made partly thin in a portion near the end portions of the gate electrodes. As a result, it may cause a problem that the thin portion of the insulation film may be subjected to dielectric breakdown, or phosphorus contained in the atmosphere at a high density in the reflow step, which is effected in the phosphorus atmosphere after this step, reacts with boron in the BPSG film to form a deposit. The deposit will grow as a projecting portion. The projecting portion may break the metal wiring or short-circuit the metal wirings, thereby lowering the reliability and manufacturing yield of the semiconductor device. Further, when the control gate electrode is formed over the floating gate electrode, the polysilicon film is etched by use of a mask, but the mask which has the same pattern as that of the mask used for forming the floating gate electrode and selection gate electrode is used, and in practice, a polysilicon film having the same pattern as the mask is formed on the selection gate electrode although not shown in the drawing. Generally, the polysilicon film is not removed and is kept as a dummy layer in order to prevent the number of steps from being increased. Therefore, if an insulation film of BPSG or PSG is formed in this position, a deep concave may be formed in the insulation film between the floating gate electrode and the selection gate electrode. As a result, the insulation film may be more easily broken down.

In order to operate the EEPROM in a manner as described before, a high voltage of 15 to 20 V is applied. In this case, if the coupling ratio of the coupling capacitance between the gate electrodes is increased, the operation voltage can be lowered. The coupling ratio CR of a memory transistor of the conventional EEPROM is shown in FIG. 10A. CR indicates the ratio $C_2/(C_1+C_W+C_{31})$ of a capacitance $C_2$ between the control gate electrode and the floating gate electrode to the sum of capacitances $(C_1+C_W+C_{31})$ between the floating gate electrode and the semiconductor substrate. Generally, the present coupling ratio is nearly equal to 2. Thus, in a semiconductor device such as an EEPROM having the selection gate electrode, there occurs a problem that the manufacturing yield is lowered and the reliability of the semiconductor device is lowered by breakage or short-circuit of the metal wiring due to deformation of the insulation film caused by an increase in the aspect ratio between the gate electrodes and it is strongly required to lower the operation voltage.

SUMMARY OF THE INVENTION

The present invention has been made in view of the above drawbacks, and an object of the present invention is to provide a semiconductor device in which the manufacturing yield and reliability can be enhanced by preventing the dielectric breakdown of the insulation film and the breakage and short-circuit of the wirings and the coupling ratio can be enhanced, and a method of manufacturing the same.

According to an aspect of the present invention, there is provided a semiconductor memory device comprising: a semiconductor substrate of a first conductivity type; first and second impurity diffusion layers of a second conductivity type formed in the semiconductor substrate with a preset distance from each other; a selection gate electrode formed over that area of the semiconductor substrate which lies between the first and second impurity diffusion layers; a third impurity diffusion layer of the second conductivity type formed in an area of the semiconductor substrate which is different from the area lying between the first and second impurity diffusion layers and is set at a preset distance from the first impurity diffusion layer; a first gate oxide film formed on the area of the semiconductor substrate lying between the first and second impurity diffusion layers and an area of the semiconductor substrate lying between the first and third impurity diffusion layers, formed to be at least partly superposed on the selection gate electrode and having a tunnel oxide film formed on the first impurity diffusion layer; a floating gate electrode formed on portions of the first gate oxide film which lie over the area of the semiconductor substrate lying between the first and second impurity diffusion layers and the area of the semiconductor substrate lying between the second and third impurity diffusion layers and formed to be at least partly disposed over the selection gate electrode; a second gate oxide film formed on the floating gate electrode; and a control gate electrode formed over the floating gate electrode with the second gate oxide film disposed therebetween.

According to another aspect of the present invention, there is provided a semiconductor memory device comprising: a semiconductor substrate of a first conductivity type; an element isolation region formed on the semiconductor substrate to divide the semiconductor substrate into first and second element regions; first and second impurity diffusion layers of a second conductivity type formed at a preset distance from each other in the first element region; a selection gate electrode formed over that area of the first element region which lies between the first and second impurity diffusion layers; a third impurity diffusion layer of the second conductivity type formed at a preset distance from the first impurity diffusion layer and formed in an area of the first element region different from the area lying between the first and second impurity diffusion layers; a first gate oxide film formed on the area of the first element region lying between the first and second impurity diffusion layers and the area of the first element region lying between the second and third impurity diffusion layers, formed to be at least partly superposed on the selection gate electrode and having a tunnel oxide film formed on the second impurity diffusion layer; a floating gate electrode formed on portions of the first gate oxide film which lie over the area of the first element region lying between the first and second impurity diffusion layers and the area of the first element region lying between the second and third impurity diffusion layers and formed to be at least partly disposed over the selection gate electrode; a second gate oxide film formed on the second element region of the semiconductor substrate substrate; and a control gate electrode formed on the second gate oxide film and formed to be partly connected to the floating gate electrode.

According to still another aspect of the present invention, there is provided a method of manufacturing a method of manufacturing a semiconductor memory device comprising the steps of: doping an impurity into a preset area of a semiconductor substrate of a first conductivity type formed of silicon single crystal to form a channel portion; forming a selection gate electrode over the preset area of the semiconductor substrate with a gate oxide film disposed therebetween; forming a first impurity diffusion layer of a second conductivity type in the semiconductor substrate in contact with the selection gate electrode; forming a first gate oxide film which has a tunnel oxide film formed on the first impurity diffusion layer on the entire surface of the first impurity diffusion layer, the semiconductor substrate and the selection gate electrode so as to be at least partly superposed on the selection gate electrode; forming a first conductive layer for a floating gate electrode on the first gate oxide film so as to be at least partly disposed over the selection gate electrode; forming a second gate oxide film on the first conductive layer for the floating gate electrode; forming a second conductive layer for a control gate electrode on the second gate oxide film; patterning the first gate oxide film, the first conductive layer, the second gate oxide film and the second conductive layer into a preset pattern; and forming second and third impurity diffusion layers in a preset area of the semiconductor substrate in contact with the preset pattern.

According to still another aspect of the present invention, there is provided a method of manufacturing a semiconductor memory device comprising the steps of: forming an element isolation region on a semiconductor substrate of a first conductivity type formed of silicon single crystal to isolate the semiconductor substrate into first and second element regions; forming a selection gate electrode over said the element region with a gate oxide film disposed therebetween; forming first and second impurity diffusion layers of a second conductivity type in preset areas in contact with opposite side surfaces of the selection gate electrode, respectively; forming a third impurity diffusion layer of the second conductivity type in said first element region of the semiconductor substrate at a preset distance from the first impurity diffusion layer; forming a first gate oxide film which has a tunnel oxide film formed on the first impurity diffusion layer on the entire surface of the second impurity diffusion layer on the first element region of the semiconductor substrate so as to be at least partly superposed on the selection gate electrode, and at the same time, forming a second gate oxide film on the second element region; and forming a floating gate electrode on the first gate oxide film so as to be at least partly disposed over the selection gate electrode, and at the same time, forming a control gate electrode in connection with the floating gate electrode on the second gate oxide film.

In order to increase the coupling ratio, the capacitance between the floating gate electrode and the semiconductor substrate must be made small. For this purpose, the semiconductor substrate and the polysilicon surface of the selection gate electrode are oxidized with at least part of the selection gate electrode of polysilicon disposed below the floating gate electrode, and in this case, the thickness of the oxide film is adequately adjusted by a difference between the oxidation speeds. Further, since the selection gate electrode is disposed at least partly below the floating gate electrode, the cell area is reduced and the integration density is further enhanced. In a case where the selection gate electrode is formed in the groove which is formed in the semiconductor substrate, the surface of the selection gate electrode is set in substantially the same plane as the surface of the semiconductor substrate so that no significant stepped portion will be formed on an oxide film which is formed on the selection gate electrode and semiconductor substrate, thereby preventing the breakage of a polysilicon film serving as the gate electrode formed on the oxide film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view showing the construction of a semiconductor memory device according to a first embodiment of the present invention;

FIG. 4 is a cross sectional view taken along the line II—II of the semiconductor memory device according to the first embodiment of the present invention shown in FIG. 3;

FIGS. 5A, 5B, 5C, 5D, 5E and 5F are cross sectional views showing the process of manufacturing the semiconductor memory device according to the first embodiment of the present invention shown in FIG. 3;

FIG. 6 is a cross sectional view showing the construction of a semiconductor memory device according to a second embodiment of the present invention;

FIG. 7 is a plan view showing the construction of a semiconductor memory device according to a third embodiment of the present invention;

DETAILED DESCRIPTION OF THE PREFERRED EMBODIMENTS

Figure 1:
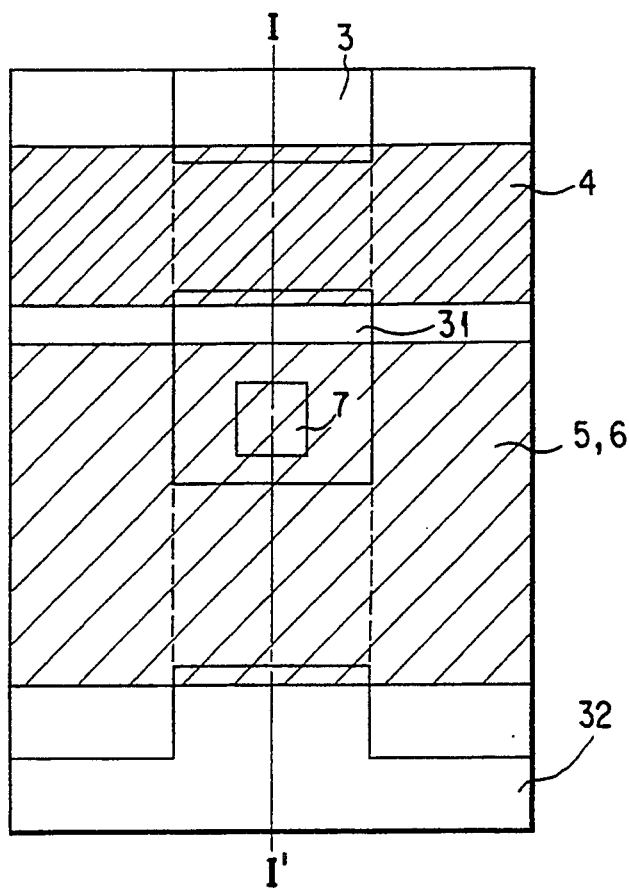
FIG. 1 is a plan view showing the construction of a conventional semiconductor memory device.
Figure 2:
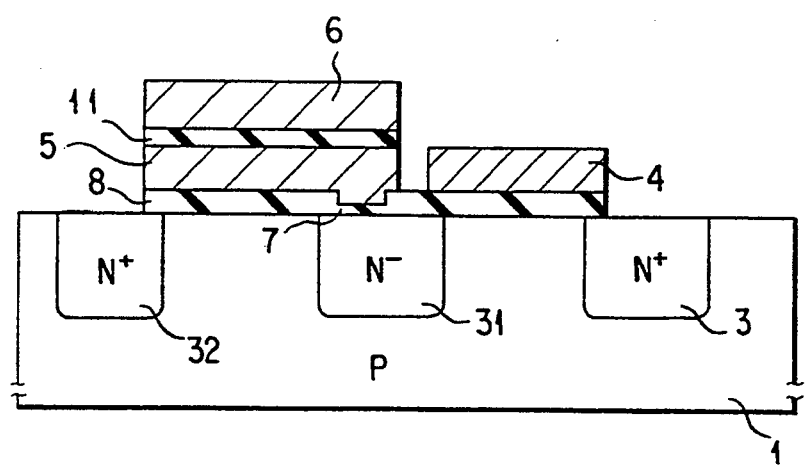
FIG. 2 is a cross sectional view taken along the line I—I' of the semiconductor memory device of FIG. 1.

There will now be described a semiconductor memory device and a method of manufacturing the same according to embodiments of the present invention with reference to the accompanying drawings.

FIG. 3 is a plan view showing the construction of an EEPROM which is a semiconductor memory device according to a first embodiment of the present invention. FIG. 4 is a cross sectional view taken along the line II—II' of FIG. 3. As shown in FIG. 3, a semiconductor substrate 1 is formed of a P-silicon substrate, for example. In this case, the fine patterning technique based on the 1.0 μm rule is used. An N⁻-diffusion layer 31 which is a first impurity diffusion layer, and second and third impurity diffusion layers (which are hereinafter referred to as N⁺-diffusion layers) 3 and 32 are formed in the P-semiconductor substrate 1. The layer 31 has an impurity concentration of approximately $10^{18}/cm^3$ and a diffusion depth of approximately 0.5 to 1.0 μm from the semiconductor substrate surface. The layers 3 and 32 have an impurity concentration of approximately $10^{20}/cm^3$ and the same diffusion depth as that of the layer 31. A groove 2 having a depth permitting the diffusion layer to be accommodated therein is formed between the first and second diffusion layers 31 and 3. A selection gate electrode 4 surrounded by a gate oxide film 4a with a thickness of approximately 0.04 μm is formed in the groove 2. The selection gate electrode 4 has a width of approximately 1.6 μm and a thickness of approximately 0.4 μm. The selection gate electrode 4 and the first and second diffusion layers 31 and 3 constitute a selection transistor. The second diffusion layer 3 serves as a drain region and the first diffusion layer 31 serves as a source region. The diffusion layers 3 and 31 are diffused under the selection gate electrode 4 by an amount of 0.2 μm. A first gate oxide film 8 with a thickness of approximately 4000 Å, a thin gate oxide film 7 with a thickness of approximately 1000 Å and a thick gate oxide film 81 with a thickness of approximately 8000 Å on an active area in which the above-described diffusion layers are formed. The gate oxide film 8 is formed on that area of the semiconductor substrate 1 of silicon single crystal which lies between the first and third diffusion layers 31 and 32, the thin oxide film 7 is formed on the first diffusion layer 31, and the thick oxide film 81 is formed on the polysilicon selection gate electrode 4. A floating gate electrode 5 of polysilicon is formed on the above-described oxide films. An interlevel insulation film (second gate oxide film) 11 is formed on the semiconductor structure and then a control gate electrode 6 of polysilicon is formed on the insulation film. Although not shown in the drawing, an insulation film of BPSG or PSG is formed to cover the above respective layers. The cell portion of the EEPROM of the present invention has the structure described above. A plurality of cells having the same structure as described above are connected to word lines and bit lines and a peripheral circuit such as a high voltage generating circuit is provided to construct the EEPROM.

Figure 10A:
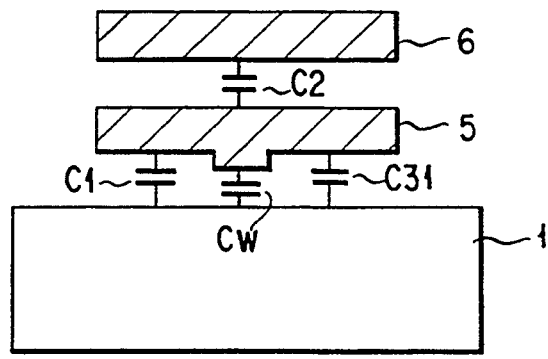
FIGS. 10A and 10B are cross sectional views for explaining the coupling ratios of the conventional semiconductor memory device and a semiconductor memory device of the present invention.
Figure 10B:
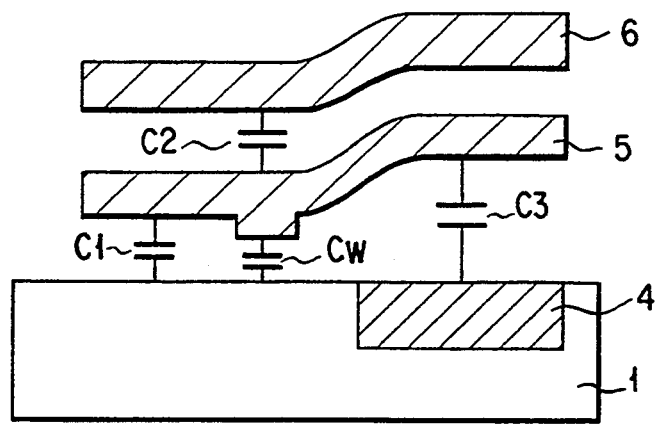

In the present invention, since the thick portion 81 can be easily formed as a gate oxide film under the floating gate electrode 5 by utilizing the difference between the oxidation speeds of polysilicon of the selection gate electrode 4 and the semiconductor substrate 1, the coupling ratio can be made large as required. In the first embodiment, the coupling ratio could be increased by 70%. The coupling ratio CR of the semiconductor device of this invention is expressed by $C_2/(C_1+C_W+C_3)$ as shown in FIG. 10B and can be made larger by changing $C_3$. Further, in the present invention, since the selection gate electrode 4, which is juxtaposed with the floating gate electrode 5 in the prior art, is formed below the floating gate electrode 5, it is not necessary to pay much attention to the aspect ratio unlike the prior art case. Besides, since the element area can be reduced by 10% or more, the integration density can be significantly enhanced.

Figure 5D:
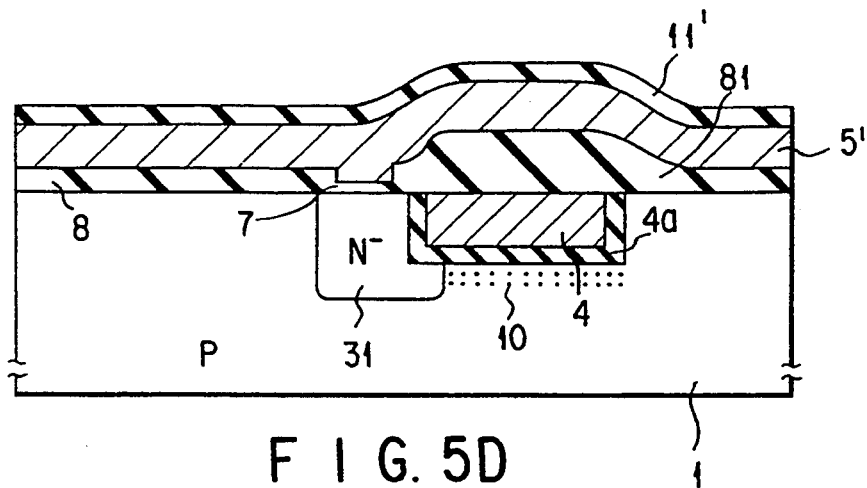
Figure 5E:
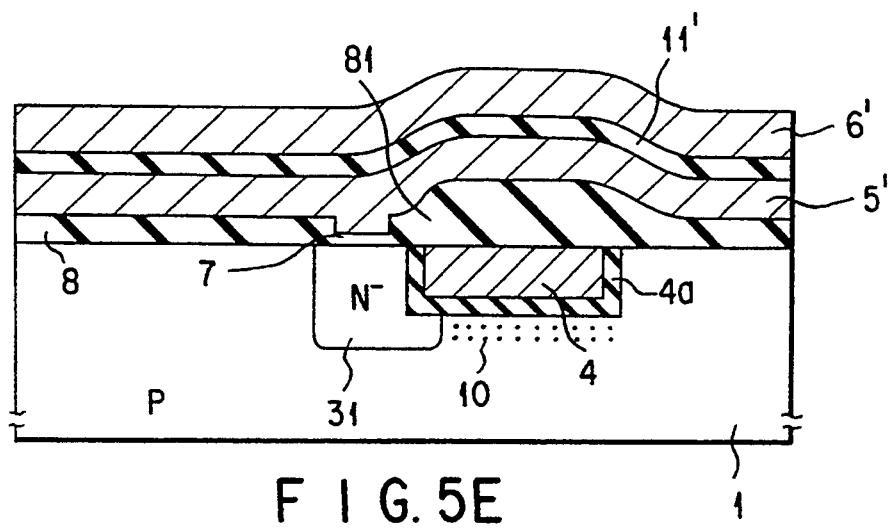
Figure 5F:
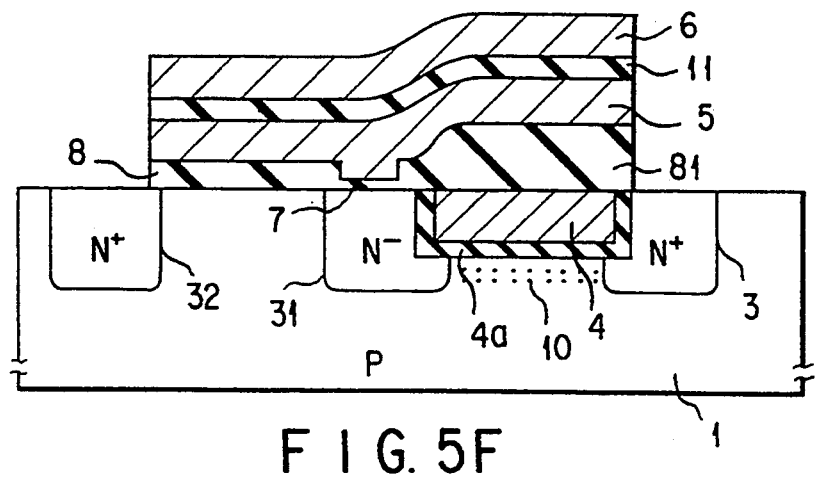

Next, with reference to FIGS. 5A to 5F, a method of manufacturing the semiconductor device of the first embodiment shown in FIG. 3 will be explained. As shown in FIG. 5A, a groove 2 which is patterned by use of a photoresist mask is formed in a P-type semiconductor substrate 1 by the well-known etching technique. For example, an impurity such as boron is ion-implanted into the semiconductor substrate 1 via the bottom surface of the groove 2 to form a channel impurity region (which is referred to as a channel region) 10. As shown in FIG. 5B, a gate oxide film $4a$ is formed to a thickness of approximately 0.04 $\mu$m on the internal surface of the groove 2 by thermal oxidation and then a selection gate electrode 4 of polysilicon is formed on the oxide film. In the first embodiment, the surface of the semiconductor substrate 1 and the surface of the selection gate electrode 4 are set in substantially the same plane, but the surface of the selection gate electrode 4 may be set in a higher position than the surface of the semiconductor substrate 1 or may be buried in the semiconductor substrate 1. As shown in FIG. 5C, an impurity such as As is ion-implanted into the semiconductor substrate 1 along the one side surface of the groove 2 (not shown). After this, implanted ions are thermally diffused to form an $N^-$-diffusion layer 31 of high impurity concentration. The $N^-$-diffusion layer 31 extends under the gate insulation film $4a$ which is formed under the selection gate electrode 4 by approximately 0.2 $\mu$m by the thermal diffusion. The extended portion $31a$ of the diffusion layer may be formed by obliquely ion-implanting impurity from the exterior. Next, as shown in FIG. 5D, the surfaces of the semiconductor substrate 1 and the selection gate electrode 4 are subjected to the thermal oxidation process at 950° C. in an oxygen atmosphere so as to form oxide films 8 and 81. Since the oxidation speeds of the silicon single crystal of the semiconductor substrate 1 and the polysilicon of the selection gate electrode 4 are different from each other, the oxide film 81 on the selection gate electrode 4 becomes approximately 800 Å when the oxide film 8 on the semiconductor substrate 1 grows to a thickness of approximately 400 Å. The oxide film on the $N^-$-diffusion layer 31 is removed by photoetching. A thin tunnel oxide film 7 is newly formed to a thickness of approximately 100 Å by thermal oxidation. A polysilicon film 5' used for forming the floating gate electrode 5 is formed on the above oxide films by the CVD method, for example. An oxide film 11' used for forming an inter-level insulation film 11 is formed by thermally oxidizing the surface of the polysilicon film 5'. As shown in FIG. 5E, a polysilicon film 6' used for forming the control gate electrode 6 is formed on the oxide film 11' by the CVD method, for example. As shown in FIG. 5F, the oxide films 8 and 81, the polysilicon films 5' and 6' and the oxide film 11' disposed therebetween are patterned by photoetching. As a result, a stacked structure having the gate oxide films 7, 8 and 81, floating gate electrode 5, interlevel insulation film 11 and control gate electrode 6 stacked in this order on the semiconductor substrate 1 is formed. Next, in the same manner as described before, an impurity such as As is ion-implanted into portions of the semiconductor substrate 1 lying near both of the side surfaces of the stacked structure to form $N^+$-diffusion layers 3 and 32. The gate oxide films 7 and 8, the floating gate electrode 5 and control gate electrode 6 formed on the gate oxide films, the $N^+$-diffusion layer 32 serving as the source region and the $N^-$-diffusion layer 31 serving as the drain region constitute a memory transistor. Further, the selection gate electrode 4, the $N^-$-diffusion layer 31 serving as the source region and the $N^+$-diffusion layer 3 serving as the drain region constitute a selection transistor. After this, the semiconductor substrate and the gate electrodes are coated with an insulation film (not shown) such as a PSG film by the CVD method, for example.

FIG. 6 is a cross sectional view showing the construction of a semiconductor memory device according to a second embodiment of the present invention. In the first embodiment, the selection gate electrode 4 is set inside the groove 2 formed in the semiconductor substrate 1, but formation of the selection gate electrode 4 is not limited to this structure. When the selection gate electrode 4 is set in the groove 2, an advantage that the gate oxide film may be formed relatively flat can be obtained. However, in this case, a process of forming the groove is necessary and formation of the diffusion layers is effected in two different steps, thereby making the manufacturing process difficult. In the second embodiment, a selection gate electrode 4 is not set into a groove of the semiconductor substrate 1 but is formed on the semiconductor substrate 1. A P-silicon substrate is used as the semiconductor substrate 1. As shown in FIG. 6, an $N^-$-diffusion layer 31 and $N^+$-diffusion layers 3 and 32 are formed in the semiconductor substrate 1. The selection gate electrode 4 and a stacked structure of the floating gate electrode 5 and control gate electrode 6 juxtaposed with and extending over the selection gate electrode 4 are formed on the semiconductor substrate 1 to constitute a selection transistor and a memory transistor. The gate oxide film 8 under the floating gate electrode 5 includes the tunnel oxide film 7. A portion of the gate oxide film which lies under the floating gate electrode 5 and is disposed on the selection gate electrode 4 is formed of a thick oxide film 81.

Next, the method of manufacturing the semiconductor device of the second embodiment shown in FIG. 6 will be explained. First, diffusion layers 31, 3 and 32 are formed in the semiconductor substrate 1. A selection gate electrode 4 is then formed over the semiconductor substrate 1 with a gate insulation film (not shown) disposed therebetween. After this, the surface of the semiconductor substrate 1 and the surface of the selection gate electrode 4 are thermally oxidized to form gate oxide films 8 and 81. The gate oxide film 8 of the tunnel region is then removed and a thin tunnel oxide film 7 is newly formed in this position. Next, the floating gate electrode 5, inter-level insulation film 11 and control gate electrode 6 are sequentially stacked and patterned to form a stacked type EEPROM cell. The floating gate electrode 5 is formed to substantially completely cover the selection gate electrode 4. In this case, a step difference between the oxide films 8 and 81 becomes larger than that of the first embodiment in which the groove is formed, but the manufacturing process is made simple.

Figure 8:
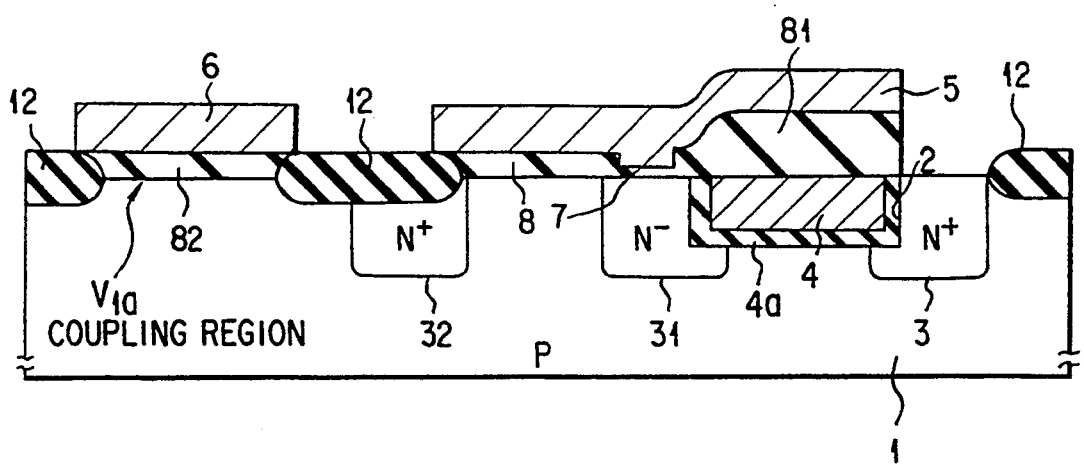
FIG. 8 is a cross sectional view taken along the line III—III' of the semiconductor memory device according to the third embodiment of the present invention shown in FIG. 7.

With reference to FIGS. 7 and 8, a third embodiment of the present invention will be explained. FIG. 7 is a plan view showing the construction of a semiconductor memory device according to a third embodiment of the present invention. FIG. 8 is a cross sectional view taken along the line III—III' of FIG. 7. In the third embodiment, a selection gate electrode 4 is formed in a groove 2 which is formed in a semiconductor substrate 1. A control gate electrode 6 and a floating gate electrode 5 are formed in the same plane. Therefore, in the third embodiment, the gate electrodes 5 and 6 can be formed by a single lithography process. However, the cell area becomes larger than that of a case wherein the stacked structure is used.

Next, a process of manufacturing the semiconductor device of the third embodiment will be explained in detail. First, an element isolation region 12 is formed in the surface area of a P-silicon semiconductor substrate 1 to form two element regions. A groove 2 is formed in one of the two element regions. A gate oxide film 4a and a selection gate electrode 4 are formed on the inner wall of the groove 2. Further, an $N^-$-diffusion layer 31 and $N^+$-diffusion layer 3 serving respectively as the source and drain regions are formed in those portions of the semiconductor substrate 1 which lie near or in contact with the side surfaces of the groove 2 to constitute a selection transistor. After this, an $N^+$-diffusion layer 32 is formed in the semiconductor substrate 1. The surfaces of the semiconductor substrate 1 and the selection gate electrode 4 then are thermally oxidized to form a gate oxide film 8 on the semiconductor substrate 1 and a thick gate oxide film 81 on the selection gate electrode 4. At this time, a gate insulation film 82 is formed on the other element region of the semiconductor substrate 1 in the same process. The oxide film formed on the first $N^-$-diffusion layer 31 serving as the source region of the selection transistor is partly removed and a thin oxide film 7 serving as a tunnel oxide film is formed in the same place. A floating gate electrode 5 is then formed on the tunnel oxide film 7 and thick oxide film 81, and at the same time, a control gate electrode 6 is formed on the gate oxide film 82 on the second element region. As shown in FIG. 7, the floating gate electrode 5 and the control gate electrode 6 are formed on the same polysilicon film and are connected to each other. That portion of the oxide film 8 which lies on an area between the $N^-$-diffusion layer 31 and $N^+$-diffusion layer 32 is used as a first gate oxide film. The oxide film 82 on the coupling region 1a which is the element region shown in FIGS. 7 and 8 is used as a second gate oxide film. The diffusion layers 31 and 32, first and second gate oxide films 8 and 82, floating gate electrode 5 and control gate electrode 6 constitute a memory transistor. In the EEPROM cell of the above structure, a high voltage is applied to the semiconductor substrate 1 to raise the potential of the control gate electrode 6 via the coupling region 1a so as to inject electrons. Thus, the coupling capacitor $C_2$ shown in FIG. 10B is formed between the coupling region 1a and the control gate electrode 6. It is preferable to set the thickness of the oxide film 82 on the coupling region as small as possible. The oxide film 82 is made thinner than the oxide film 8 lying on the area between the diffusion regions 31 and 32 and is equal to or thicker than the tunnel oxide film 7. Also, in the third embodiment, the selection gate electrode 4 may be formed on the semiconductor substrate 1 instead of being formed in the groove 2 as in the second embodiment.

Figure 9:
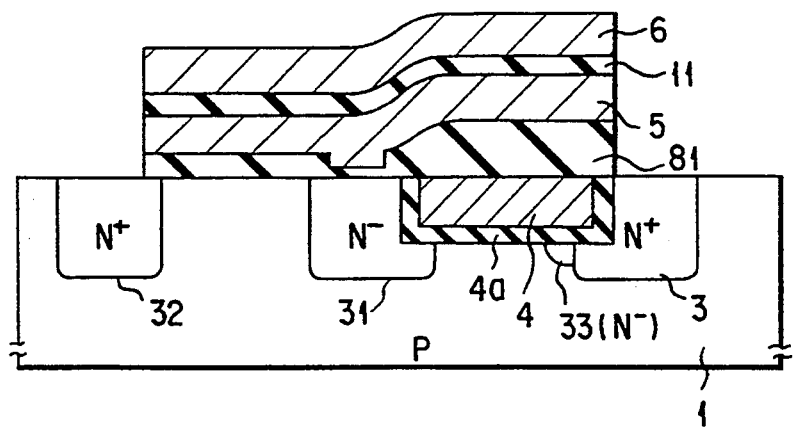
FIG. 9 is a cross sectional view showing the construction of a semiconductor memory device according to a fourth embodiment of the present invention.

With reference to FIG. 9, the fourth embodiment of the present invention will be explained. As described before, when the EEPROM memory is set in the writing mode, a high voltage of, for example, 20 V is applied to the $N^+$-diffusion layer 3 which is the drain region of the selection transistor. In the fourth embodiment, an $N^-$-diffusion layer 33 of low impurity concentration is formed in or near the channel portion on the side of the drain region between the gate insulation film 4a for the gate electrode 4 and the drain region 3 so as to form an LDD structure. With this structure, the electric field near the drain region 3 can be weakened and the breakdown voltage of the drain region 3 can be enhanced.

Figure 11:
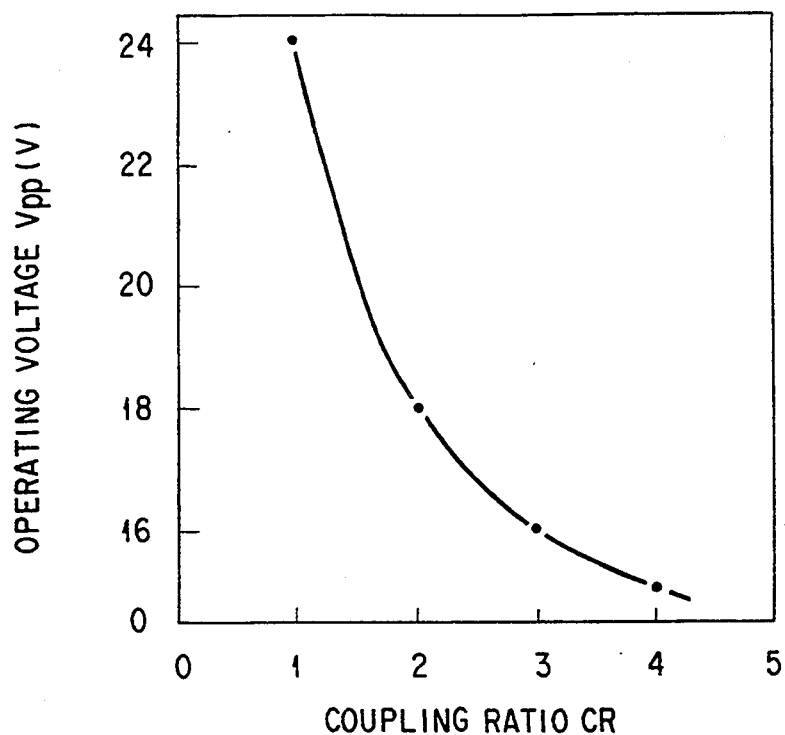
FIG. 11 is a characteristic diagram showing the relation between the coupling ratio and the operating voltage of the semiconductor memory device of the present invention.

In each of the above embodiments, since a thick gate oxide film can be formed, the coupling ratio CR can be raised. The relation between the operation voltage $V_{PP}$ of the memory of the present invention and the coupling ratio CR may be expressed by $V_{PP}=(1+CR^{-1})V_{FG}$. $V_{FG}$ indicates a voltage applied to the floating gate. The relation between $V_{pp}$ and CR set when a voltage of 12 V is used as $V_{FG}$ is shown in FIG. 11. As shown in FIG. 11, when CR is increased, the operating voltage $V_{FG}$ can be significantly lowered and the operating voltage can be set lower than that of the conventional case by 3 V or more. Further, the memory size can be reduced by 10% or more.

The present invention is characterized by utilizing a difference between the thermal oxidation speeds of polysilicon and single crystal silicon. When polysilicon (polycrystalline silicon) is subjected to the thermal treatment in the oxidation atmosphere, a $SiO_2$ film of good quality is formed on the surface thereof. When an impurity is doped into polysilicon at a high impurity concentration, the oxidation speed thereof becomes significantly enhanced in comparison with that of single crystal silicon.

Figure 12:
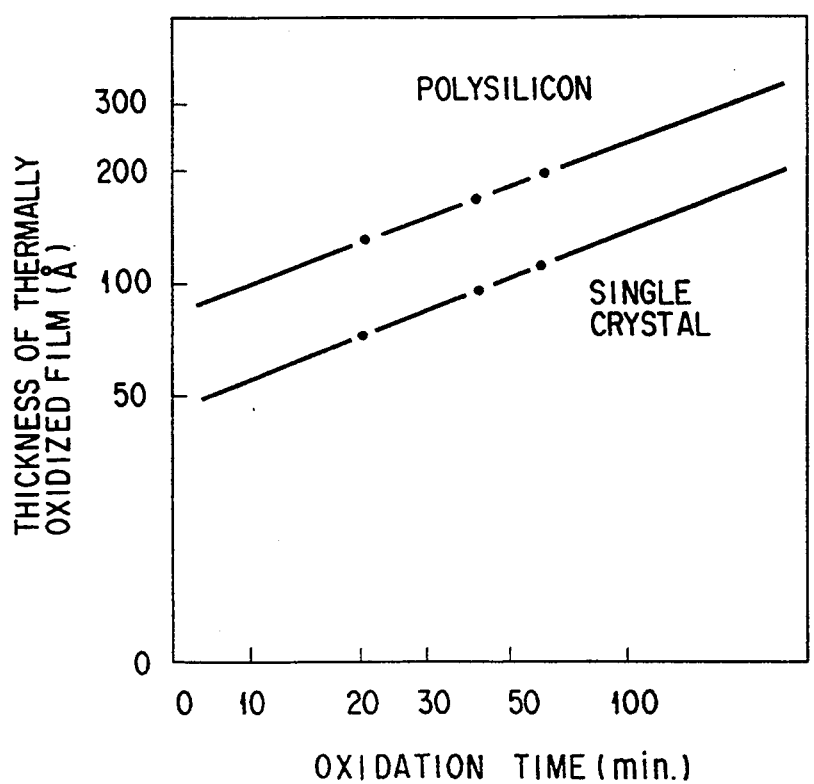
FIG. 12 is a characteristic diagram showing a difference between the thermal oxidation speeds of polysilicon and single crystal silicon.

With reference to FIG. 12, a difference between the oxidation speed of polysilicon in the former embodiment and that of single crystal silicon will be explained. FIG. 12 shows an oxidation speed-heat treatment time characteristic diagram in which the ordinate indicates the thickness (Å) of an oxide film formed by subjecting silicon to the heat treatment and the abscissa indicates the heat treatment time (minutes). In this example, the heat treatment process is effected in a nitrogen atmosphere containing oxygen. The heating condition is set to 1000° C. but the heating process is effected by first inserting a to-be-treated substrate into an oxidation furnace which is heated to 850° C., raising the temperature thereof to 1000° C. at a rate of 10° C./minute, and then lowering the temperature thereof to 850° C. at a rate of 2° C./minute after completion of the heat treatment. As shown in FIG. 12, the oxidation speed of polysilicon is higher than that of single crystal silicon. Further, since the oxidation speed of polysilicon greatly varies with the impurity concentration, a difference between the thickness of the oxide film on the semiconductor substrate and that of the oxide film on the selection gate electrode can be freely changed by use of the structure of this invention. Further, it is not necessary to bury the selection gate electrode in the groove of the semiconductor substrate and the selection gate electrode can be formed over the semiconductor substrate.

As described above, according to each of the above embodiments, the P-silicon semiconductor substrate is used. The present invention is not limited to use of the p-silicon substrate, and an N-silicon semiconductor substrate may be used, for example. A substrate of semiconductor material other than silicon can be used.

In the present invention, since the above structure is used and the gate oxide film under the floating gate electrode is made adequately thick, the coupling ratio can be enhanced. Further, since the selection gate electrode can be disposed below the floating gate electrode, the cell size can be sufficiently reduced and the integration density of the semiconductor device can be significantly enhanced.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device, comprising:
a semiconductor substrate of a first conductivity type;
first and second impurity diffusion layers of a second conductivity type formed in said semiconductor substrate with a first preset distance therebetween;
a selection gate electrode formed over that area of said semiconductor substrate between said first and second impurity diffusion layers, said selection gate electrode being formed in a groove which is formed in a portion of said semiconductor substrate between said first and second impurity diffusion layers;
a third impurity diffusion layer of said second conductivity type formed in an area of said semiconductor substrate which is different from the area between said first and second impurity diffusion layers and is at a second preset distance from said first impurity diffusion layer;
a first gate oxide film formed on the area of said semiconductor substrate between said first and second impurity diffusion layers and an area of said semiconductor substrate between said first and third impurity diffusion layers, formed to be at least partly superposed on said selection gate electrode and having a tunnel oxide film formed on said first impurity diffusion layer;
a floating gate electrode formed on portions of said first gate oxide film which lie over the area of said semiconductor substrate between said first and second impurity diffusion layers and the area of said semiconductor substrate between said second and third impurity diffusion layers and formed to be at least partly disposed over said selection gate electrode;
a second gate oxide film formed on said floating gate electrode; and
a control gate electrode formed over said floating gate electrode with said second gate oxide film disposed therebetween.

2. A semiconductor memory device comprising:
a semiconductor substrate of a first conductivity type;
an element isolation region formed on said semiconductor substrate to divide said semiconductor substrate into said and second element regions;
first and second impurity diffusion layers of a second conductivity type formed at a preset distance from each other in said first element region;
a selection gate electrode formed over that area of said first element region between said first and second impurity diffusion layers, said selection gate electrode being formed in a groove which is formed in a portion of said semiconductor substrate lying between first and second impurity diffusion layers;
a third impurity diffusion layer of said second conductivity type formed at a preset distance from said first impurity diffusion layer and formed in an area of said first element region different from the area between said first and second impurity diffusion layers;
a first gate oxide film formed on the area of said first element region between said first and second impurity diffusion layers and the area of said first element region between said first and third impurity diffusion layers, formed to be at least partly superposed on said selection gate electrode, and having a tunnel oxide film formed on said first impurity diffusion layer;
a floating gate electrode formed on portions of said first gate oxide film over the area of said first element region between said first and second impurity diffusion layers and the area of said first element region lying between said first and third impurity diffusion layers and formed to be at least partly disposed over said selection gate electrode;
a second gate oxide film formed on said second element region of said semiconductor substrate; and
a control gate electrode formed on said second gate oxide film and formed to be electrically connected to said floating gate electrode.

3. The semiconductor memory device according to claim 1, wherein said second impurity diffusion layer is formed with an LDD structure.

4. The semiconductor memory device according to claim 1, wherein the thickness of a portion of said first gate oxide film formed on said selection gate electrode is greater than the thickness of a portion of said first gate oxide film formed on said semiconductor substrate.

5. The semiconductor memory device according to claim 4, wherein a capacitance between said portion of said first gate oxide film formed on said selection gate electrode and said selection gate electrode is different than a capacitance between said portion of said first gate oxide film formed on said semiconductor substrate and said semiconductor substrate.

6. The semiconductor memory device according to claim 2, wherein said second impurity diffusion layer is formed with an LDD structure.

7. The semiconductor memory device according to claim 2, wherein the thickness of a portion of said first gate oxide film formed on said selection gate electrode is greater than the thickness of a portion of said first gate oxide film formed on said semiconductor substrate.

8. The semiconductor memory device according to claim 7, wherein a capacitance between said portion of said first gate oxide film formed on said selection gate electrode and said selection gate electrode is different than a capacitance between said portion of said first gate oxide film formed on said semiconductor substrate and said semiconductor substrate.

9. A semiconductor memory device, comprising:
   a body of semiconductor material of a first conductivity type having a major surface;
   first, second, and third regions of a second conductivity type formed in said major surface of said semiconductor body;
   a conductive layer insulatively spaced from a channel region between said first and second regions;
   a floating gate electrode for storing charge;
   a first insulating film portion for insulating said floating gate from a channel region between said second and third regions;
   a second insulating film portion for insulating said floating gate from said conductive layer, said second insulating film portion having a thickness greater than a thickness of said first insulating film portion;
   a control gate electrode; and
   a groove formed in said major surface of said semiconductor body between said first and second regions, said groove having sidewalls and a bottom wall, wherein at least a portion of said conductive layer is formed in said groove and said conductive layer is insulatively spaced from said channel region between said first and second regions by an insulating film formed on said bottom wall of said groove.

10. The semiconductor memory device according to claim 9, wherein a top surface of said conductive layer is substantially coplanar with said major surface of said semiconductor body.

11. The semiconductor memory device according to claim 9, wherein portions of said first and second regions extend under said groove.

* * * * *